(12) United States Patent
Lambourne

(10) Patent No.: US 8,843,228 B2
(45) Date of Patent: Sep. 23, 2014

(54) METHOD AND APPARATUS FOR UPDATING ZONE CONFIGURATIONS IN A MULTI-ZONE SYSTEM

(71) Applicant: Sonos, Inc., Santa Barbara, CA (US)

(72) Inventor: Robert A Lambourne, Santa Barbara, CA (US)

(73) Assignee: Sonos, Inc, Santa Barbara, CA (US)

( * ) Notice: Subject to any disclaimer, the term of this patent is extended or adjusted under 35 U.S.C. 154(b) by 0 days.

(21) Appl. No.: 13/896,829

(22) Filed: May 17, 2013

(65) Prior Publication Data

US 2013/0293345 A1 Nov. 7, 2013

Related U.S. Application Data

(63) Continuation of application No. 11/853,790, filed on Sep. 11, 2007, now Pat. No. 8,483,853.

(60) Provisional application No. 60/825,407, filed on Sep. 12, 2006.

(51) Int. Cl.
*G06F 17/00* (2006.01)
*G06F 3/16* (2006.01)
*H04N 21/436* (2011.01)
*H03G 7/00* (2006.01)
*H04R 3/12* (2006.01)

(52) U.S. Cl.
CPC .. *H03G 7/00* (2013.01); *G06F 3/16* (2013.01); *H04N 21/43615* (2013.01); *H04R 3/12* (2013.01)
USPC ............................................................ 700/94

(58) Field of Classification Search
USPC ............................................................ 700/94
See application file for complete search history.

(56) References Cited

U.S. PATENT DOCUMENTS

| 5,182,552 | A | | 1/1993 | Paynting |
| 5,946,343 | A | * | 8/1999 | Schotz et al. ................ 375/141 |
| 6,587,127 | B1 | | 7/2003 | Leeke et al. |
| 6,604,023 | B1 | | 8/2003 | Brown et al. |
| 6,631,410 | B1 | | 10/2003 | Kowalski et al. |

(Continued)

FOREIGN PATENT DOCUMENTS

| WO | 2005013047 A2 | 2/2005 |
| WO | 2012137190 A1 | 10/2012 |

OTHER PUBLICATIONS

Yamaha DME Designer 2.0 manual; Copyright 2004.*
United; States Patent and Trademark Office., "Advisory Action mailed Dec. 22, 2011 for U.S. Appl. No. 11/853,790, filed Sep. 11, 2007", Dec. 22, 2011, 2 pages.

(Continued)

*Primary Examiner* — Paul McCord
(74) *Attorney, Agent, or Firm* — Hanley, Flight and Zimmerman, LLC

(57) ABSTRACT

In general, techniques of controlling a plurality of multimedia players in groups are disclosed. According to one aspect of the present invention, a mechanism is provided to allow a user to group some of the players according to a theme or scene, where each of the players is located in a zone. When the scene is activated, the players in the scene react in a synchronized manner. For example, the players in the scene are all caused to play a multimedia source or music in a playlist, wherein the multimedia source may be located anywhere on a network.

16 Claims, 11 Drawing Sheets

(56) References Cited

U.S. PATENT DOCUMENTS

| | | | |
|---|---|---|---|
| 6,778,869 B2* | 8/2004 | Champion | 700/94 |
| 7,130,608 B2 | 10/2006 | Hollstrom et al. | |
| 7,187,947 B1 | 3/2007 | White et al. | |
| 7,218,708 B2 | 5/2007 | Berezowski et al. | |
| 7,539,551 B2 | 5/2009 | Komura et al. | |
| 7,558,224 B1 | 7/2009 | Surazski et al. | |
| 7,571,014 B1 | 8/2009 | Lambourne et al. | |
| 7,643,894 B2 | 1/2010 | Braithwaite et al. | |
| 7,668,990 B2 | 2/2010 | Krzyzanowski et al. | |
| 7,742,832 B1 | 6/2010 | Feldman et al. | |
| 7,761,176 B2 | 7/2010 | Ben-Yaacov et al. | |
| 7,805,210 B2 | 9/2010 | Cucos et al. | |
| 7,849,181 B2 | 12/2010 | Slemmer et al. | |
| 7,962,482 B2* | 6/2011 | Handman et al. | 707/733 |
| 8,045,952 B2 | 10/2011 | Qureshey et al. | |
| 8,189,824 B2* | 5/2012 | Strauss et al. | 381/300 |
| 8,234,395 B2 | 7/2012 | Millington | |
| 8,239,559 B2 | 8/2012 | Rajapakse | |
| 8,290,603 B1 | 10/2012 | Lambourne | |
| 8,700,730 B2 | 4/2014 | Rowe | |
| 2002/0002039 A1 | 1/2002 | Qureshey et al. | |
| 2002/0003548 A1 | 1/2002 | Krusche et al. | |
| 2002/0072816 A1* | 6/2002 | Shdema et al. | 700/94 |
| 2002/0124097 A1 | 9/2002 | Isely et al. | |
| 2003/0020763 A1 | 1/2003 | Mayer et al. | |
| 2003/0167335 A1* | 9/2003 | Alexander | 709/228 |
| 2003/0177889 A1* | 9/2003 | Koseki et al. | 84/609 |
| 2003/0198257 A1 | 10/2003 | Sullivan et al. | |
| 2004/0010727 A1 | 1/2004 | Fujinami | |
| 2004/0015252 A1 | 1/2004 | Aiso et al. | |
| 2004/0117044 A1* | 6/2004 | Konetski | 700/94 |
| 2004/0131192 A1 | 7/2004 | Metcalf | |
| 2004/0223622 A1 | 11/2004 | Lindemann et al. | |
| 2004/0225389 A1* | 11/2004 | Ledoux et al. | 700/94 |
| 2005/0002535 A1* | 1/2005 | Liu et al. | 381/58 |
| 2005/0021470 A1* | 1/2005 | Martin et al. | 705/51 |
| 2005/0131558 A1 | 6/2005 | Braithwaite et al. | |
| 2005/0144284 A1* | 6/2005 | Ludwig et al. | 709/226 |
| 2005/0254505 A1 | 11/2005 | Chang et al. | |
| 2005/0289224 A1 | 12/2005 | Deslippe et al. | |
| 2006/0041616 A1* | 2/2006 | Ludwig et al. | 709/204 |
| 2006/0149402 A1 | 7/2006 | Chung | |
| 2007/0142022 A1 | 6/2007 | Madonna et al. | |
| 2007/0142944 A1 | 6/2007 | Goldberg et al. | |
| 2007/0189544 A1 | 8/2007 | Rosenberg | |
| 2007/0288610 A1* | 12/2007 | Saint Clair et al. | 709/220 |
| 2008/0025535 A1* | 1/2008 | Rajapakse | 381/311 |
| 2008/0045140 A1 | 2/2008 | Korhonen | |
| 2008/0066094 A1 | 3/2008 | Igoe | |
| 2008/0077261 A1 | 3/2008 | Baudino et al. | |
| 2008/0144861 A1 | 6/2008 | Melanson et al. | |
| 2008/0152165 A1 | 6/2008 | Zacchi | |
| 2009/0228919 A1 | 9/2009 | Zott et al. | |

OTHER PUBLICATIONS

United; States Patent and Trademark Office., "Final Office Action mailed Oct. 13, 2011 for U.S. Appl. No. 11/853,790, filed Sep. 11, 2007", Nov. 13, 2011, 10 pages.

United; States Patent and Trademark Office., "Notice of Allowability mailed Apr. 18, 2013 for U.S. Appl. No. 11/853,790, filed Sep. 11, 2007", Apr. 18, 2013, 4 pages.

United; States Patent and Trademark Office., "Office Action mailed Mar. 8, 2011 for U.S. Appl. No. 11/853,790, filed Sep. 11, 2007", Mar. 8, 2011, 10 pages.

"UPnP; "Universal Plug and Play Device Architecture"; Jun. 8, 2000; version 1.0; Microsoft Corporation; pp. 1-54".

Voyetra; Turtle Beach Inc., "AudioTron Quick Start Guide, Version 1.0", Mar. 2001, 24 pages.

Voyetra; Turtle Beach Inc., "AudioTron Reference Manual, Version 3.0", May 2002, 70 pages.

Voyvoyetra; Turtle Beach Inc., "AudioTron Setup Guide, Version 3.0", May 2002, 32 pages.ETRA; Turtle Beach Inc., "AudioTron Setup Guide, Version 3.0", May 2002, 32 pages.

"Yamaha DME 32 manual": copyright 2000, pp. 296.

Co-pending U.S. Appl. No. 13/083,499, filed Apr. 8, 2011, 69 pages.

United States Patent and Trademark Office, "Final Office Action", issued in connection with U.S. Appl. No. 13/013,740, mailed on Feb. 10, 2014, 13 pages.

International Bureau, "International preliminary report on patentability," issued in connection with International Patent Application No. PCT/IB2012/052071, mailed Oct. 17, 2013, 7 pages.

United States Patent and Trademark Office, "Non-Final Office Action", issued in connection with U.S. Appl. No. 13/013,740, mailed on Sep. 27, 2013, 12 pages.

The United States Patent and Trademark Office, "Non-Final Office Action", issued in connection with U.S. Appl. No. 13/083,499, mailed Feb. 10, 2014, 11 pages.

Rane: DragNet software; available for sale at least 2006, 8 pages.

Yamaha DME Designer software manual: Copyright 2004, 482 pages.

International Bureau, "Search Report", issued in connection with PCT Application No. PCT/IB2012/052071, mailed on Aug. 23, 2012, 3 pages.

Jo J., et al., "Synchronized One-to-many Media Streaming with Adaptive Playout Control," Proceedings of SPIE, 2002, vol. 4861, pp. 71-82.

Mills D.L., "Network Time Protocol (Version 3) Specification, Implementation and Analysis," Network Working Group, Mar. 1992, <http://www.ietf.org/rfc/rfc1305.txt>, 7 pages.

"Polycom Conference Composer manual: copyright 2001", 29 pages.

International Bureau, "Written Opinion", issued in connection with PCT Application No. PCT/IB2012/052071, mailed on Aug. 23, 2012, 6 pages.

* cited by examiner

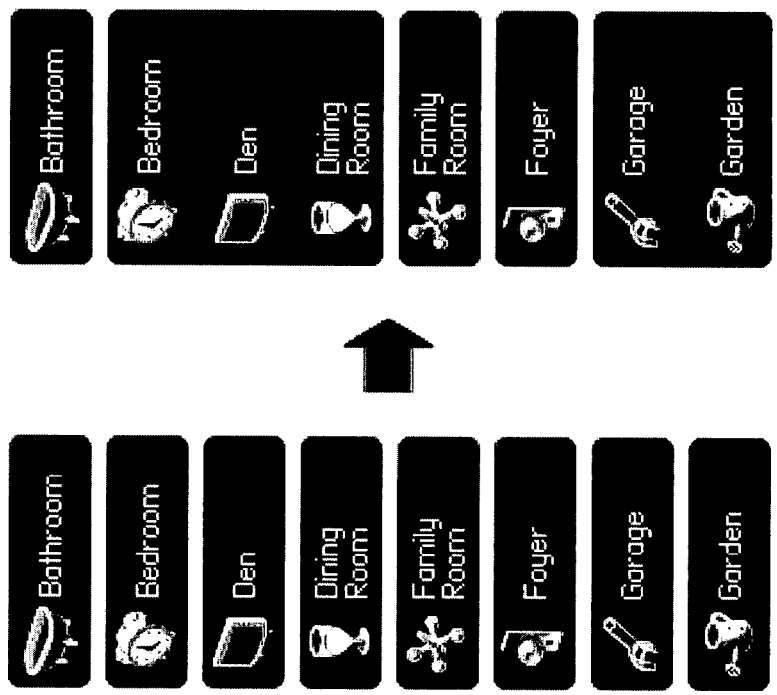

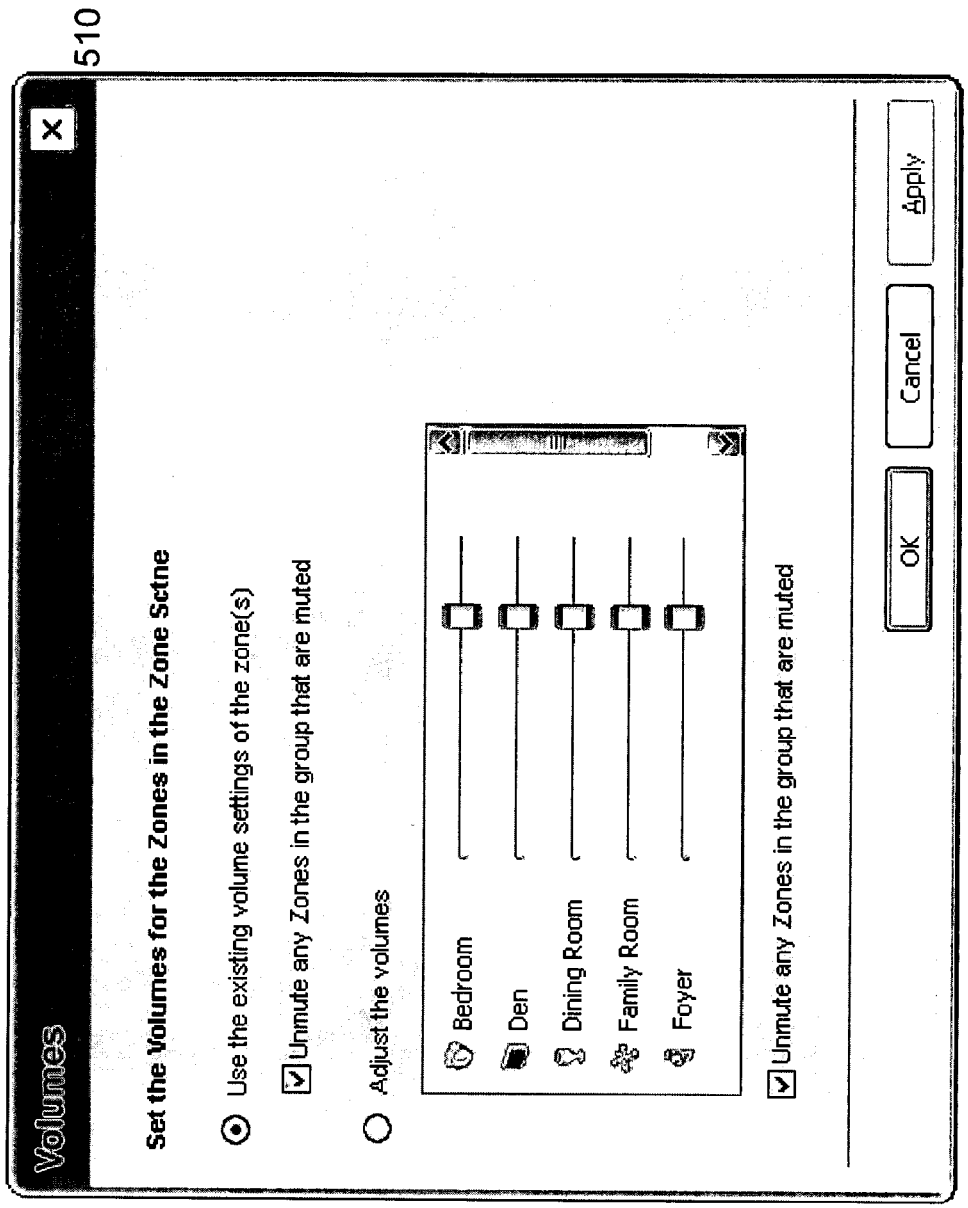

METHOD AND APPARATUS FOR UPDATING ZONE CONFIGURATIONS IN A MULTI-ZONE SYSTEM

CROSS REFERENCE TO RELATED APPLICATION

This application is a continuation of and claims priority to patent application Ser. No. 11/853,790, filed Sep. 11, 2007, entitled "CONTROLLING AND MANIPULATING GROUPINGS IN A MULTI-ZONE MEDIA SYSTEM," and U.S. Provisional Application No. 60/825,407 filed on Sep. 12, 2006, entitled "CONTROLLING AND MANIPULATING GROUPINGS IN A MULTI-ZONE MEDIA SYSTEM," each of which is hereby incorporated by reference in its entirety for all purposes.

BACKGROUND OF THE INVENTION

Field of the Invention

The invention is generally related to the area of consumer electronics and human-computer interaction. In particular, the invention is related to method and apparatus for controlling or manipulating a plurality of multimedia players in a multi-zone system.

An enduring passion for quality audio reproduction or system is continuing to drive demands from users. One of the demands includes an audio system in a house in which, for example, one could grill to classic rock on a patio while another one may cook up his/her own music selections in a kitchen. This is all at the same time while a teenager catches a ballgame in a family room, and another one blasts pop in a bedroom. And the best part of such audio system is that each family member does not need his or her own stereo system—one system gives everyone access to all the music sources.

Currently, one of the systems that can meet part of such demand is a conventional multi-zone audio system that usually includes a number of audio players. Each of the audio players has its own amplifier(s) and a set of speakers and typically installed in one place (e.g., a room). In order to play an audio source at one location, the audio source must be provided locally or from a centralized location. When the audio source is provided locally, the multi-zone audio system functions as a collection of many stereo systems, making source sharing difficult. When the audio source is provided centrally, the centralized location may include a juke box, many compact discs, an AM or FM radio, tapes, or others. To send an audio source to an audio player demanding such source, a cross-bar type of device is used to prevent the audio source from going to other audio players that may be playing other audio sources.

In order to achieve playing different audio sources in different audio players, the traditional multi-zone audio system is generally either hard-wired or controlled by a pre-configured and pre-programmed controller. While the pre-programmed configuration may be satisfactory in one situation, it may not be suitable for another situation. For example, a person would like to listen to broadcast news from his/her favorite radio station in a bedroom, a bathroom and a den while preparing to go to work in the morning. The same person may wish to listen in the den and the living room to music from a compact disc in the evening. In order to satisfy such requirements, two groups of audio players must be established. In the morning, the audio players in the bedroom, the bathroom and the den need to be grouped for the broadcast news. In the evening, the audio players in the den and the living room are grouped for the music. Over the weekend, the audio players in the den, the living room, and a kitchen are grouped for party music. Because the morning group, the evening group and the weekend group contain the den, it can be difficult for the traditional system to accommodate the requirement of dynamically managing the ad hoc creation and deletion of groups.

There is a need for dynamic control of the audio players as a group. With a minimum manipulation, the audio players may be readily grouped. In a traditional multi-zone audio system, the audio players have to be adjusted one at a time, resulting in an inconvenient and non-homogenous audio environment. Further, there is a need to individually or systematically adjust the audio volume of the audio players.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to controlling a plurality of multimedia players, or simply players, in groups. According to one aspect of the present invention, a mechanism is provided to allow a user to group some of the players according to a theme or scene, where each of the players is located in a zone. When the scene is activated, the players in the scene react in a synchronized manner. For example, the players in the scene are all caused to play an audio source or music in a playlist, wherein the audio source may be located anywhere on a network.

According to another aspect of the present invention, the scene may be activated at any time or a specific time. A user may activate the scene at any time so that only some selected zones in an entertainment system facilitate a playback of an audio source. When the scene is activated at a specific time, the scene may be used as an alarm or buzzer.

According to still another aspect of the present invention, a controlling device (also referred to herein as controller) is provided to facilitate a user to select any of the players in the system to form respective groups each of which is set up per a scene. Although various scenes may be saved in any of the members in a group, commands are preferably sent from the controller to the rest of the members when one of the scenes is executed. Depending on implementation, the commands include parameters pertaining to identifiers of the players, volumes settings, audio source and etc.

According to yet another aspect of the present invention, a configurable module is implemented in the controlling device that provides interactive graphic user interface for forming, managing and controlling groups in the system, de-grouping a group or adjusting audio volume of individual players or a group of players.

The present invention may be implemented in many forms including software, hardware or a combination of both. According to one embodiment, the present invention is directed to a method for groupings in a multi-zone media system, the method comprises providing a mechanism to allow a user to determine which players in the system to be associated with a theme representing a group; and configuring the theme with parameters pertaining to the players, wherein the theme is activated at anytime or a specific time so that the players react in a synchronized manner. The players in a scene are synchronized to play a multimedia file when the scene is activated.

According to another embodiment, the present invention is directed to an entertainment system for grouping players, the system comprises: a plurality of players, each located in one zone; and a controller providing a mechanism to allow a user to select which of the players to be associated with a theme representing a group; and configure the theme with parameters pertaining to the selected players, wherein the theme is activated at anytime or a specific time so that the selected players react in a synchronized manner. As a result, the selected players are synchronized to play a multimedia that is in a digital format and retrieved from a source over a network.

One of the objects, features, and advantages of the present invention is to remotely control a plurality of multimedia players in a multi-zone system, playing and controlling the audio source synchronously if the players are grouped together, or playing and controlling the audio source individually if the players are disassociated with each other.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 3B shows that a user defines multiple groups to be gathered at the same time;

FIG. 5C shows a user interface to allow a user to adjust a volume level of the zone players in a zone scene individually or collectively.

DETAILED DESCRIPTION OF THE PREFERRED EMBODIMENTS

The detailed description of the invention is presented largely in terms of procedures in terms of procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
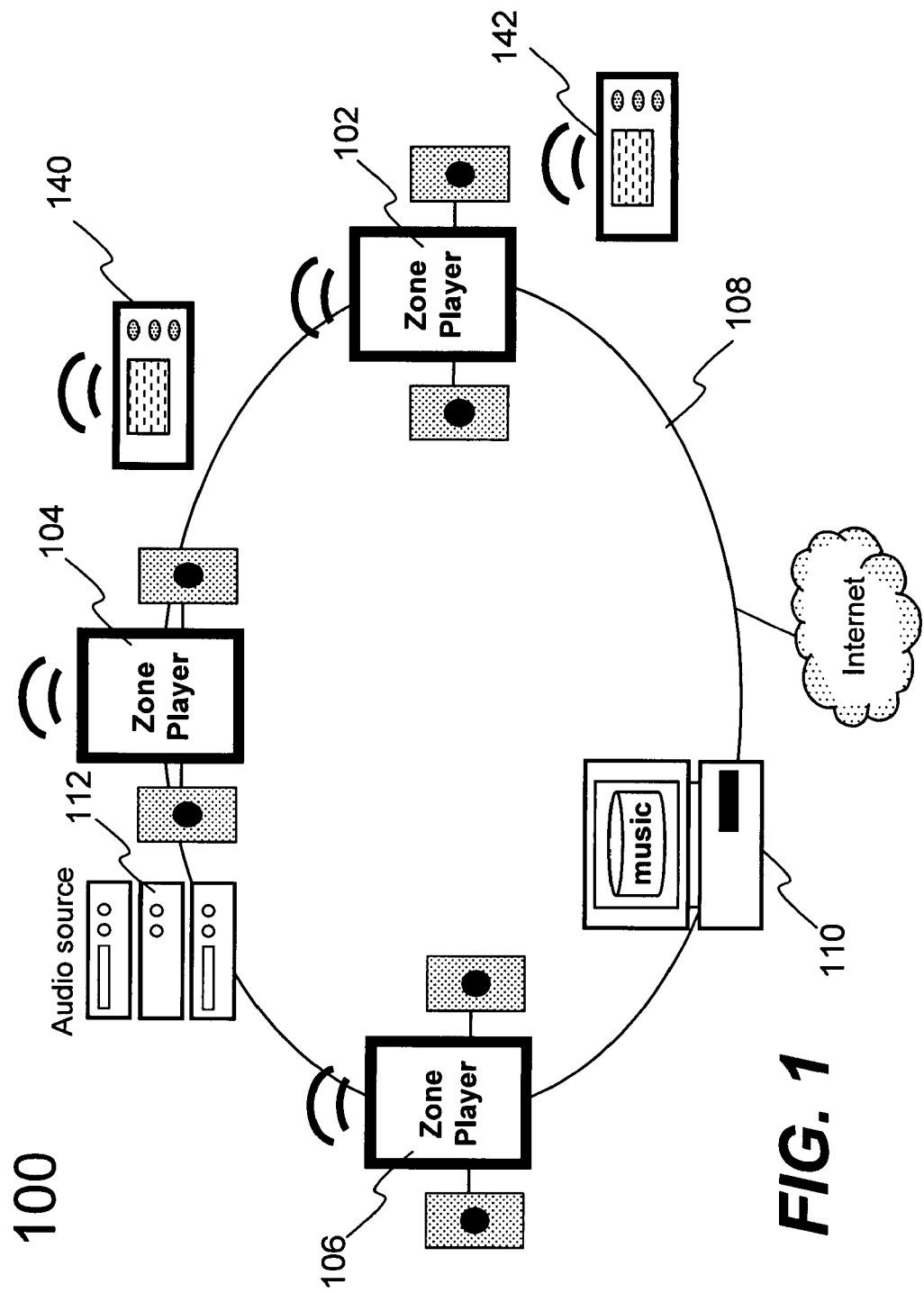
FIG. 1 shows an exemplary configuration in which the present invention may be practiced.

Referring now to the drawings, in which like numerals refer to like parts throughout the several views. FIG. 1 shows an exemplary configuration 100 in which the present invention may be practiced. The configuration may represent, but not be limited to, a part of a residential home, a business building or a complex with multiple zones. There are a number of multimedia players of which three examples 102, 104 and 106 are shown as audio devices. Each of the audio devices may be installed or provided in one particular area or zone and hence referred to as a zone player herein.

As used herein, unless explicitly stated otherwise, an audio source or audio sources are in digital format and can be transported or streamed over a data network. To facilitate the understanding of the present invention, it is assumed that the configuration 100 represents a home. Thus, the zone player 102 and 104 may be located in two of the bedrooms respectively while the zone player 106 may be installed in a living room. All of the zone players 102, 104 and 106 are coupled directly or indirectly to a data network 108. In addition, a computing device 110 is shown to be coupled on the network 108. In reality, any other devices such as a home gateway device, a storage device, or an MP3 player may be coupled to the network 108 as well.

The network 108 may be a wired network, a wireless network or a combination of both. In one example, all devices including the zone players 102, 104 and 106 are coupled to the network 108 by wireless means based on an industry standard such as IEEE 802.11. In yet another example, all devices including the zone players 102, 104 and 106 are part of a local area network that communicates with a wide area network (e.g., the Internet).

Many devices on the network 108 are configured to download and store audio sources. For example, the computing device 110 can download audio sources from the Internet and store the downloaded sources locally for sharing with other devices on the Internet or the network 108. The computing device 110 or any of the zone players can also be configured to receive streaming audio. Shown as a stereo system, the device 112 is configured to receive an analog audio source (e.g., from broadcasting) or retrieve a digital audio source (e.g., from a compact disk). The analog audio sources can be converted to digital audio sources. In accordance with the present invention, the audio source may be shared among the devices on the network 108.

Two or more zone players may be grouped together to form a new zone group. Any combinations of zone players and an existing zone group may be grouped together. In one instance, a new zone group is formed by adding one zone player to another zone player or an existing zone group.

Figure 2A:
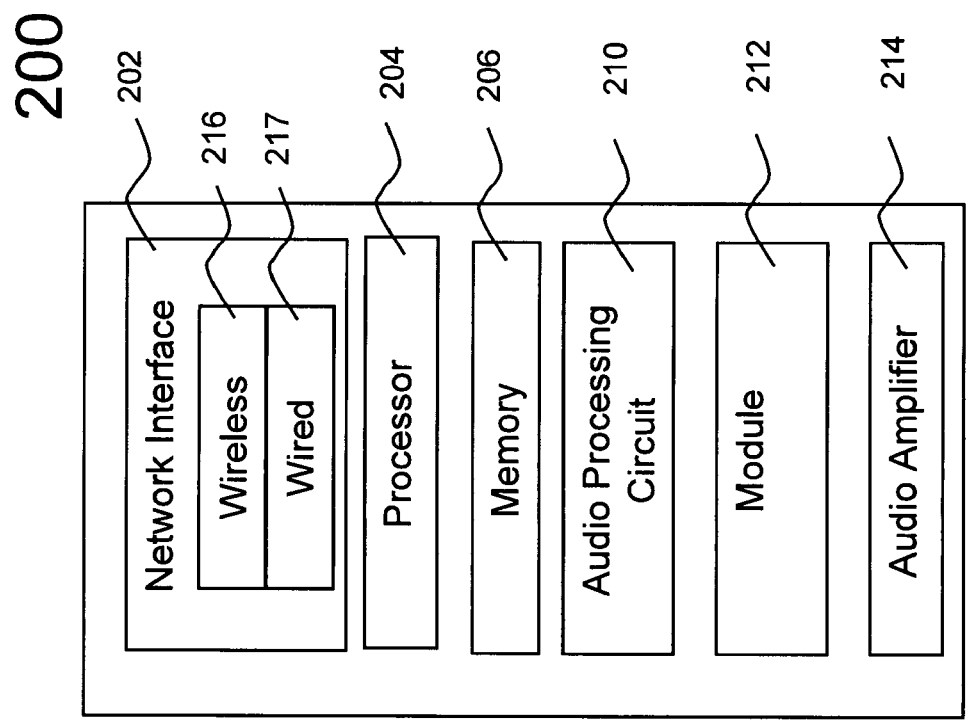
FIG. 2A shows an exemplary functional block diagram of a player in accordance with the present invention.

Referring now to FIG. 2A, there is shown an exemplary functional block diagram of a zone player 200 in accordance with the present invention. The zone player 200 includes a network interface 202, a processor 204, a memory 206, an audio processing circuit 210, a module 212, and optionally, an audio amplifier 214 that may be internal or external. The network interface 202 facilitates a data flow between a data network (i.e., the data network 108 of FIG. 1) and the zone player 200 and typically executes a special set of rules (i.e., a protocol) to send data back and forth. One of the common protocols used in the Internet is TCP/IP (Transmission Control Protocol/Internet Protocol). In general, a network interface manages the assembling of an audio source or file into smaller packets that are transmitted over the data network or reassembles received packets into the original source or file. In addition, the network interface 202 handles the address part of each packet so that it gets to the right destination or intercepts packets destined for the zone player 200.

The network interface 202 may include one or both of a wireless interface 216 and a wired interface 217. The wireless interface 216, also referred to as a RF interface, provides network interface functions by a wireless means for the zone player 200 to communicate with other devices in accordance with a communication protocol (such as the wireless standard IEEE 802.11a, 802.11b or 802.11g). The wired interface 217 provides network interface functions by a wired means (e.g., an Ethernet cable). In one embodiment, a zone player includes both of the interfaces 216 and 217, and other zone players include only a RF or wired interface. Thus these other zone players communicate with other devices on a network or retrieve audio sources via the zone player. The processor 204 is configured to control the operation of other parts in the zone player 200. The memory 206 may be loaded with one or more software modules that can be executed by the processor 204 to achieve desired tasks. According to one aspect of the present invention, a software module implementing one embodiment of the present invention is executed, the processor 204 operates in accordance with the software module in reference to a saved zone group configuration characterizing a zone group created by a user, the zone player 200 is caused to retrieve an audio source from another zone player or a device on the network.

According to one embodiment of the present invention, the memory 206 is used to save one or more saved zone configuration files that may be retrieved for modification at any time. Typically, a saved zone group configuration file is transmitted to a controller (e.g., the controlling device 140 or 142 of FIG. 1, a computer, a portable device, or a TV) when a user operates the controlling device. The zone group configuration provides an interactive user interface so that various manipulations or control of the zone players may be performed.

The audio processing circuit 210 resembles most of the circuitry in an audio playback device and includes one or more digital-to-analog converters (DAC), an audio preprocessing part, an audio enhancement part or a digital signal processor and others. In operation, when an audio source is retrieved via the network interface 202, the audio source is processed in the audio processing circuit 210 to produce analog audio signals. The processed analog audio signals are then provided to the audio amplifier 214 for playback on speakers. In addition, the audio processing circuit 210 may include necessary circuitry to process analog signals as inputs to produce digital signals for sharing with other devices on a network.

Depending on an exact implementation, the module 212 may be implemented as a combination of hardware and software. In one embodiment, the module 212 is used to save a scene. The audio amplifier 214 is typically an analog circuit that powers the provided analog audio signals to drive one or more speakers.

Figure 2B:
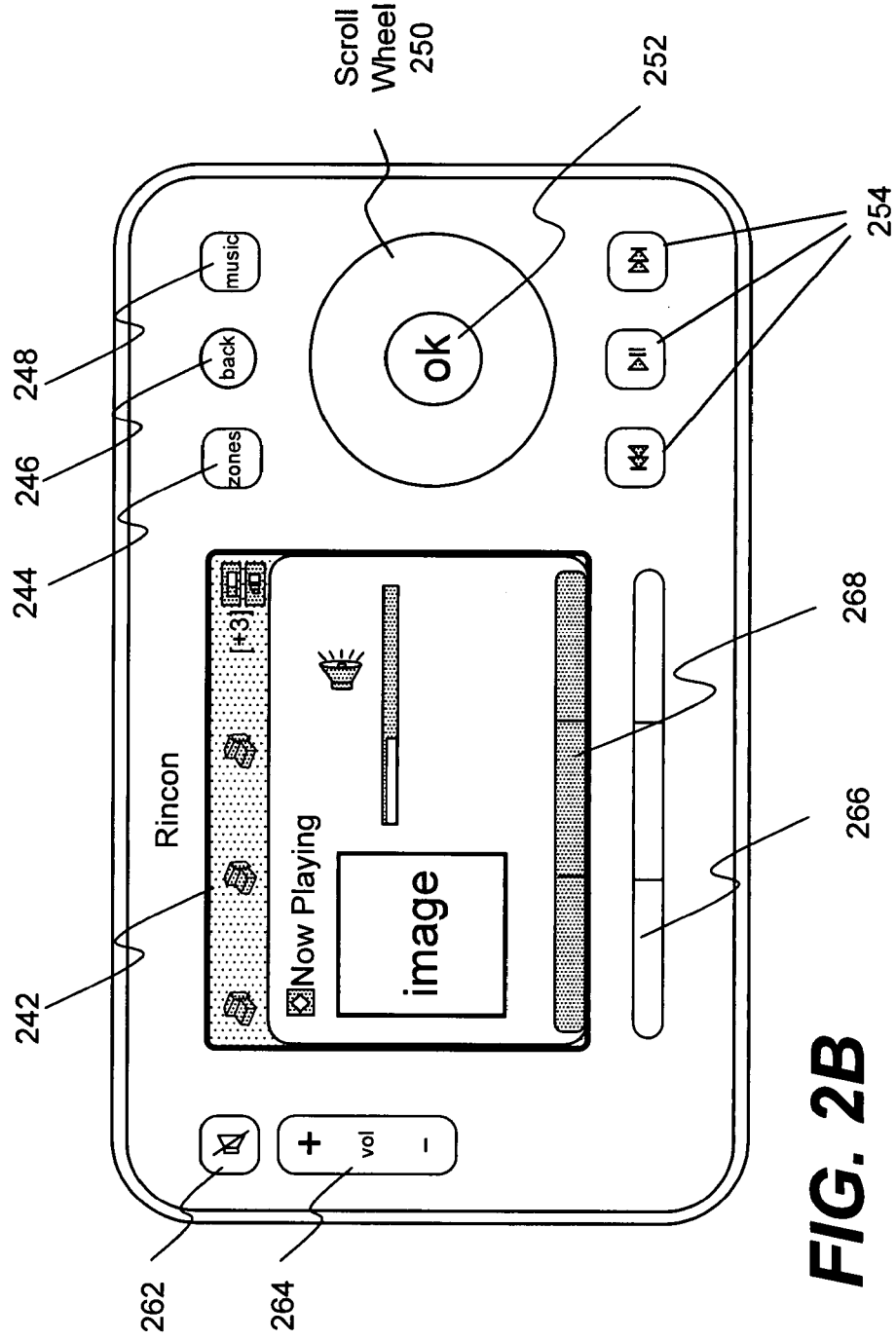
FIG. 2B shows an example of a controller that may be used to remotely control one of more players of FIG. 2A.

Referring now to FIG. 2B, there is shown an exemplary controller 240, which may correspond to the controlling device 140 or 142 of FIG. 1. The controller 240 may be used to facilitate the control of multi-media applications, automation and others in a complex. In particular, the controller 240 is configured to facilitate a selection of a plurality of audio sources available on the network, controlling operations of one or more zone players (e.g., the zone player 200) through a RF interface corresponding to the RF interface 216 of FIG. 2A. According to one embodiment, the wireless means is based on an industry standard (e.g., infrared, radio, wireless standard IEEE 802.11a, 802.11b or 802.11g). When a particular audio source is being played in the zone player 200, a picture, if there is any, associated with the audio source may be transmitted from the zone player 200 to the controller 240 for display. In one embodiment, the controller 240 is used to synchronize more than one zone players by grouping the zone players in a group. In another embodiment, the controller 240 is used to control the volume of each of the zone players in a zone group individually or together.

The user interface for the controller 240 includes a screen 242 (e.g., a LCD screen) and a set of functional buttons as follows: a "zones" button 244, a "back" button 246, a "music" button 248, a scroll wheel 250, "ok" button 252, a set of transport control buttons 254, a mute button 262, a volume up/down button 264, a set of soft buttons 266 corresponding to the labels 268 displayed on the screen 242.

The screen 242 displays various screen menus in response to a user's selection. In one embodiment, the "zones" button 244 activates a zone management screen or "Zone Menu", which is described in more details below. The "back" button 246 may lead to different actions depending on the current screen. In one embodiment, the "back" button triggers the current screen display to go back to a previous one. In another embodiment, the 'back' button negates the user's erroneous selection. The "music" button 248 activates a music menu, which allows the selection of an audio source (e.g., a song) to be added to a zone player's music queue for playback.

The scroll wheel 250 is used for selecting an item within a list, whenever a list is presented on the screen 242. When the items in the list are too many to be accommodated in one screen display, a scroll indicator such as a scroll bar or a scroll arrow is displayed beside the list. When the scroll indicator is displayed, a user may rotate the scroll wheel 250 to either choose a displayed item or display a hidden item in the list. The "ok" button 252 is used to confirm the user selection on the screen 242.

There are three transport buttons 254, which are used to control the effect of the currently playing song. For example, the functions of the transport buttons may include play/pause and forward/rewind a song, move forward to a next song track, or move backward to a previous track. According to one embodiment, pressing one of the volume control buttons such as the mute button 262 or the volume up/down button 264 activates a volume panel. In addition, there are three soft buttons 266 that can be activated in accordance with the labels 268 on the screen 242. It can be understood that, in a multi-zone system, there may be multiple audio sources being played respectively in more than one zone players. The music transport functions described herein shall apply selectively to one of the sources when a corresponding one of the zone players or zone groups is selected.

Figure 2C:
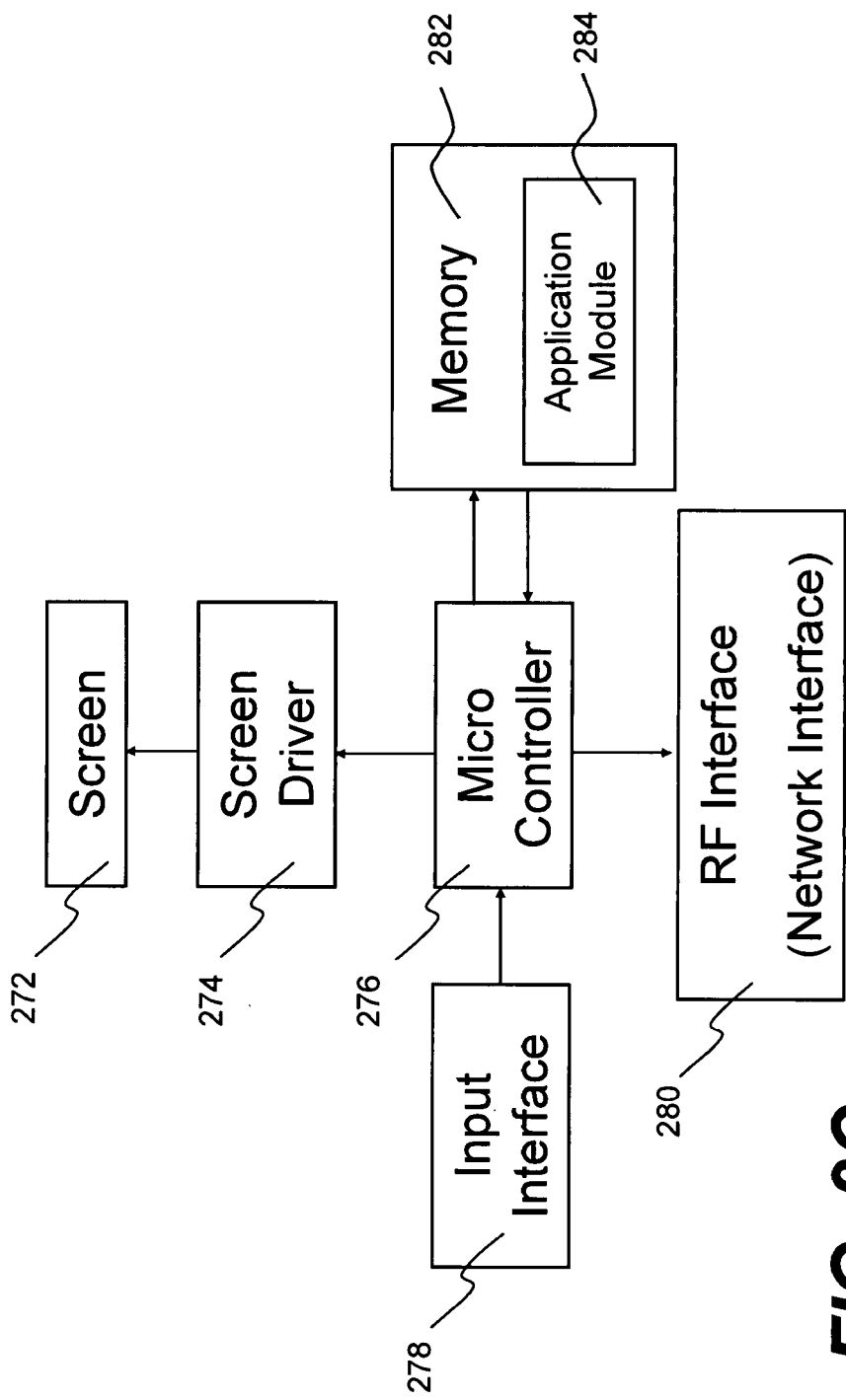
FIG. 2C shows an exemplary internal functional block diagram of a controller in accordance with one embodiment of the present invention.

FIG. 2C illustrates an internal functional block diagram of an exemplary controller 270, which may correspond to the controller 240 of FIG. 2B. The screen 272 on the controller 270 may be a LCD screen. The screen 272 communicates with and is commanded by a screen driver 274 that is controlled by a microcontroller (e.g., a processor) 276. The memory 282 may be loaded with one or more application modules 284 that can be executed by the microcontroller 276 with or without a user input via the user interface 278 to achieve desired tasks. In one embodiment, an application module is configured to facilitate grouping a number of selected zone players into a zone group and synchronizing the zone players for one audio source. In another embodiment, an application module is configured to control together the audio volumes of the zone players in a zone group. In operation, when the microcontroller 276 executes one of the application modules 284, the screen driver 274 generates control signals to drive the screen 272 to display an application specific user interface accordingly, more of which will be described below.

The controller 270 includes a network interface 280 referred to as a RF interface 280 that facilitates wireless communication with a zone player via a corresponding RF interface thereof. In one embodiment, the commands such as volume control and audio playback synchronization are sent via the RF interfaces. In another embodiment, a saved zone group configuration is transmitted between a zone player and a controller via the RF interfaces. The controller 270 may control one or more zone players, such as 102, 104 and 106 of FIG. 1. Nevertheless, there may be more than one controllers, each preferably in a zone (e.g., a room) and configured to control any one and all of the zone players.

In one embodiment, a user creates a zone group including at least two zone players from the controller 240 that sends signals or data to one of the zone players. As all the zone players are coupled on a network, the received signals in one zone player can cause other zone players in the group to be synchronized so that all the zone players in the group playback an identical audio source or a list of identical audio sources in a timely synchronized manner. Similarly, when a user increases the audio volume of the group from the controller, the signals or data of increasing the audio volume for the group are sent to one of the zone players and causes other zone players in the group to be increased together in volume and in scale.

According to one implementation, an application module is loaded in memory 282 for zone group management. When a predetermined key (e.g. the "zones" button 244) is activated on the controller 240, the application module is executed in the microcontroller 276. The input interface 278 coupled to and controlled by the microcontroller 276 receives inputs from a user. A "Zone Menu" is then displayed on the screen 272. The user may start grouping zone players into a zone group by activating a "Link Zones" or "Add Zone" soft button, or de-grouping a zone group by activating an "Unlink Zones" or "Drop Zone" button. The detail of the zone group manipulation will be further discussed below.

As described above, the input interface 278 includes a number of function buttons as well as a screen graphical user interface. It should be pointed out that the controller 240 in FIG. 2B is not the only controlling device that may practice the present invention. Other devices that provide the equivalent control functions (e.g., a computing device, a hand-held device) may also be configured to practice the present invention. In the above description, unless otherwise specifically described, it is clear that keys or buttons are generally referred to as either the physical buttons or soft buttons, enabling a user to enter a command or data.

One mechanism for 'joining' zone players together for music playback is to link a number of zone players together to form a group. To link a number of zone players together, a user may manually link each zone player or room one after the other. For example, there is a multi-zone system that includes the following zones.

Bathroom
Bedroom
Den
Dining Room
Family Room
Foyer

If the user wishes to link 5 of the 6 zone players using the current mechanism, he/she must start with a single zone and then manually link each zone to that zone. This mechanism may be sometimes quite time consuming. According to one embodiment, a set of zones can be dynamically linked together using one command. Using what is referred to herein as a theme or a zone scene, zones can be configured in a particular scene (e.g., morning, afternoon, or garden), where a predefined zone grouping and setting of attributes for the grouping are automatically effectuated.

Figure 3A:
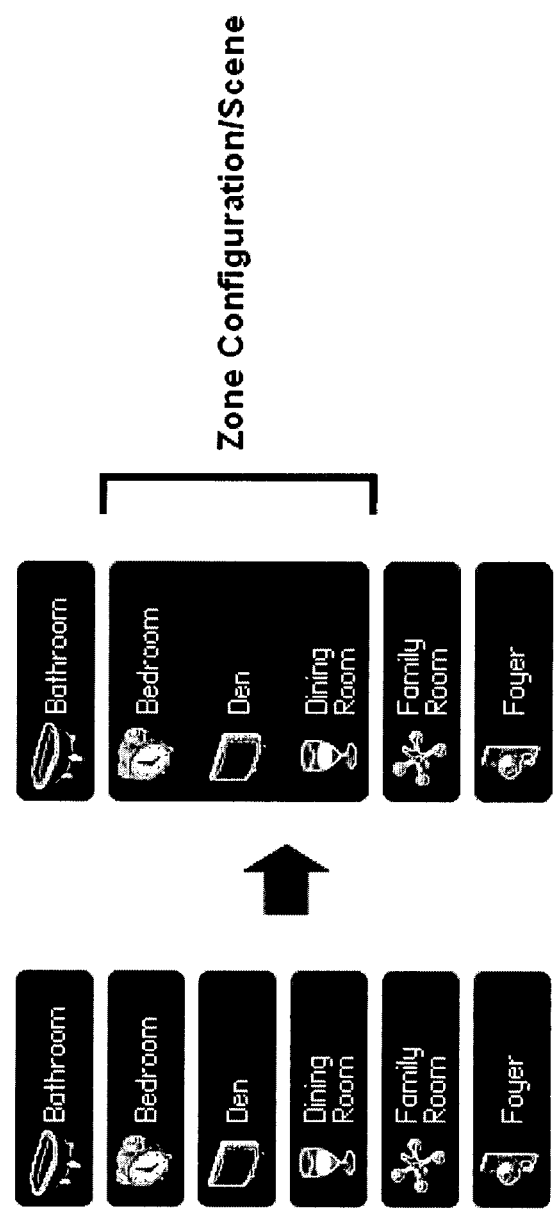
FIG. 3A provides an illustration of one zone scene, where the left column shows the starting zone grouping—all zones are separate, the column on the right shows the effects of grouping the zones to make a group of 3 zones named after "Morning"

For instance, a "Morning" zone scene/configuration command would link the Bedroom, Den and Dining Room together in one action. Without this single command, the user would need to manually and individually link each zone. FIG. 3A provides an illustration of one zone scene, where the left column shows the starting zone grouping—all zones are separate, the column on the right shows the effects of grouping the zones to make a group of 3 zones named after "Morning".

Expanding this idea further, a Zone Scene can be set to create multiple sets of linked zones. For example, a scene creates 3 separate groups of zones, the downstairs zones would be linked together, the upstairs zones would be linked together in their own group, and the outside zones (in this case the patio) would move into a group of its own.

In one embodiment as shown in FIG. 3B, a user defines multiple groups to be gathered at the same time. For example: an "Evening Scene" is desired to link the following zones:

Group 1
  Bedroom
  Den
  Dining Room
Group 2
  Garage
  Garden where Bathroom, Family Room and Foyer should be separated from any group if they were part of a group before the Zone Scene was invoked.

One important of the features, benefits and objects in the present invention is that that zones do not need to be separated before a zone scene is invoked. In one embodiment, a command is provided and links all zones in one step, if invoked. The command is in a form of a zone scene. After linking the appropriate zones, a zone scene command could apply the following attributes:

Set volumes levels in each zones (each zone can have a different volume) Mute/Unmute zones.
Select and play specific music in the zones.
Set the play mode of the music (Shuffle, Repeat, Shuffle-repeat)
Set the music playback equalization of each zone (e.g., bass treble).

A further extension of this embodiment is to trigger a zone scene command as an alarm clock function. For instance the zone scene is set to apply at 8:00 am. It could link appropriate zones automatically, set specific music to play and then stop the music after a defined duration. Although a single zone may be assigned to an alarm, a scene set as an alarm clock provides a synchronized alarm, allowing any zones linked in the scene to play a predefined audio (e.g., a favorable song, a predefined playlist) at a specific time or for a specific duration. If, for any reason, the scheduled music failed to be played (e.g., an empty playlist, no connection to a share, failed UPnP, no Internet connection for an Internet Radio station), a backup buzzer will sound. This buzzer will be a sound file that is stored in a zone player.

Figure 4:
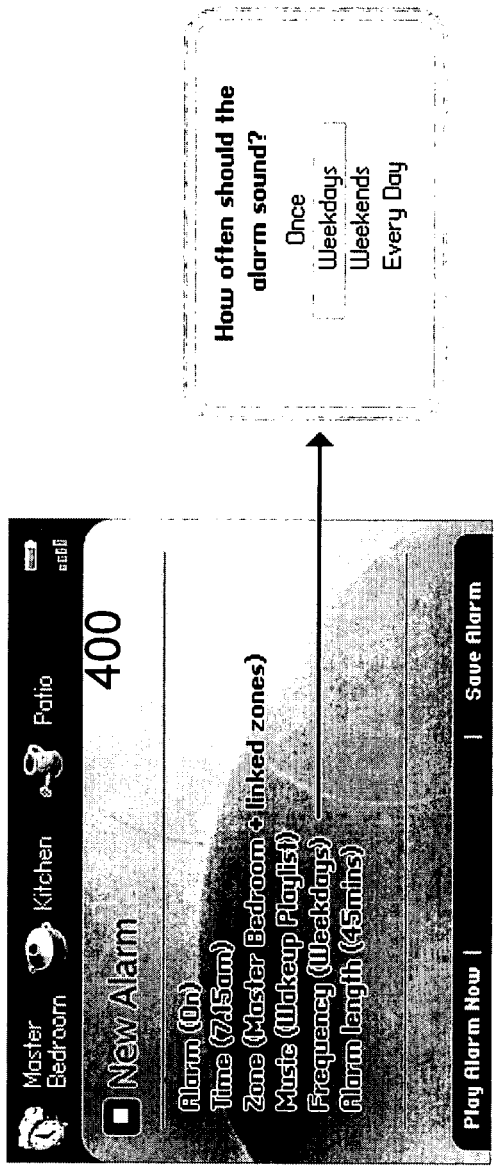
FIG. 4 shows an exemplary user interface that may be displayed on a controller or a computer of FIG. 1.

FIG. 4 shows an exemplary user interface 400 that may be displayed on a controller 142 or a computer 110 of FIG. 1. The interface 400 shows a list of items that may be set up by a user to cause a scene to function at a specific time. In the embodiment shown in FIG. 4, the list of items includes "Alarm", "Time", "Zone", "Music", "Frequency" and "Alarm length". "Alarm" can be set on or off. When "Alarm" is set on, "Time" is a specific time to set off the alarm. "Zone" shows which zone players are being set to play a specified audio at the specific time. "Music" shows what to be played when the specific time arrives. "Frequency" allows the user to define a frequency of the alarm. "Alarm length" defines how long the audio is to be played. It should be noted that the user interface 400 is provided herein to show some of the functions associated with setting up an alarm. Depending on an exact implementation, other functions, such as time zone, daylight savings, time synchronization, and time/date format for display may also be provided without departing from the present invention.

According to one embodiment, each zone player in a scene may be set up for different alarms. For example, a "Morning" scene includes three zone players, each in a bedroom, a den, and a dining room. After selecting the scene, the user may set up an alarm for the scene as whole. As a result, each of the zone players will be activated at a specific time.

Figure 5A:
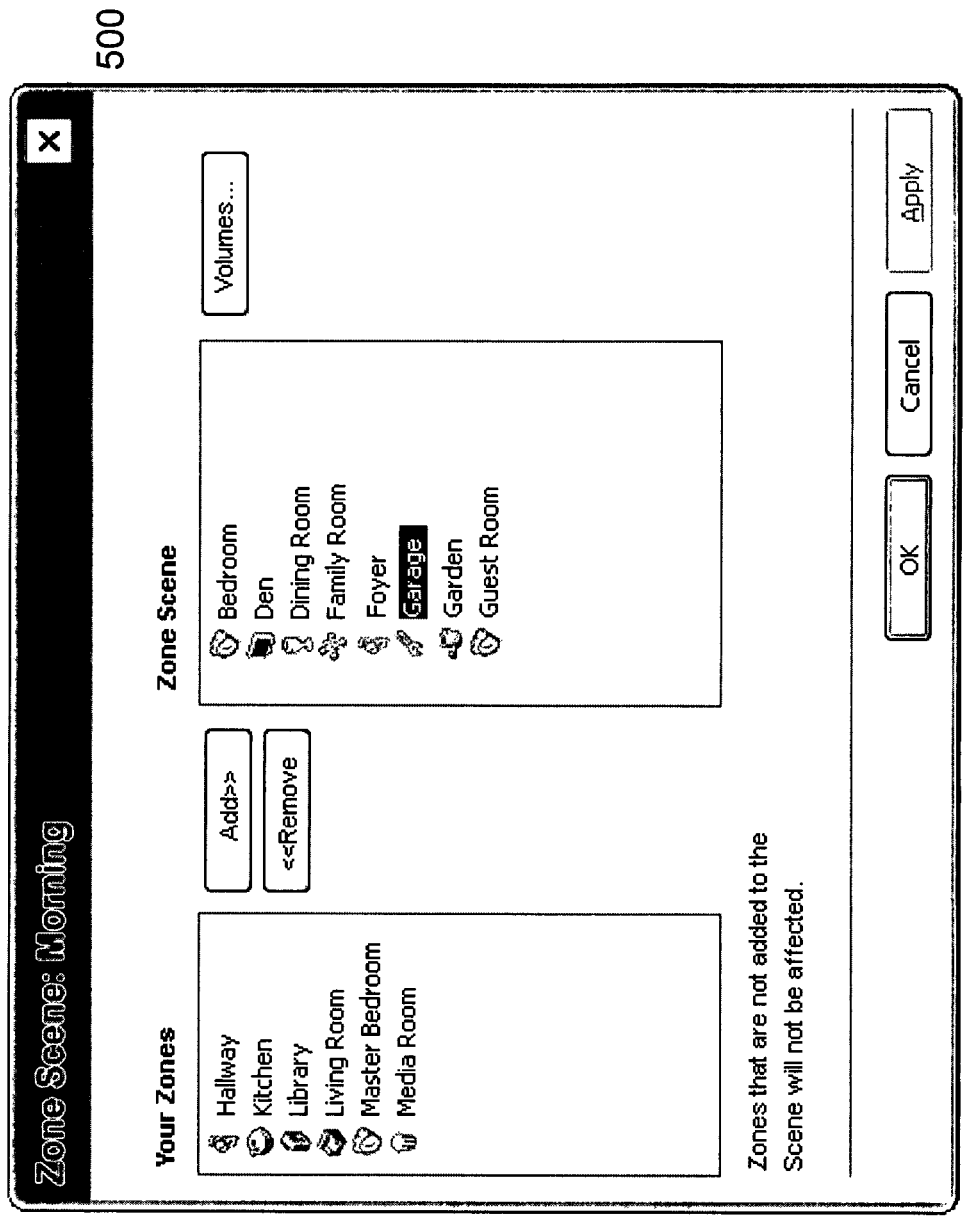
FIG. 5A shows a user interface to allow a user to form a scene.

FIG. 5A shows a user interface 500 to allow a user to form a scene. The panel on the left shows the available zones in a household. The panel on the right shows the zones that have been selected and be grouped as part of this scene. Depending on an exact implementation of a user interface, Add/Remove buttons may be provided to move zones between the panels, or zones may be dragged along between panels.

Figure 5B:
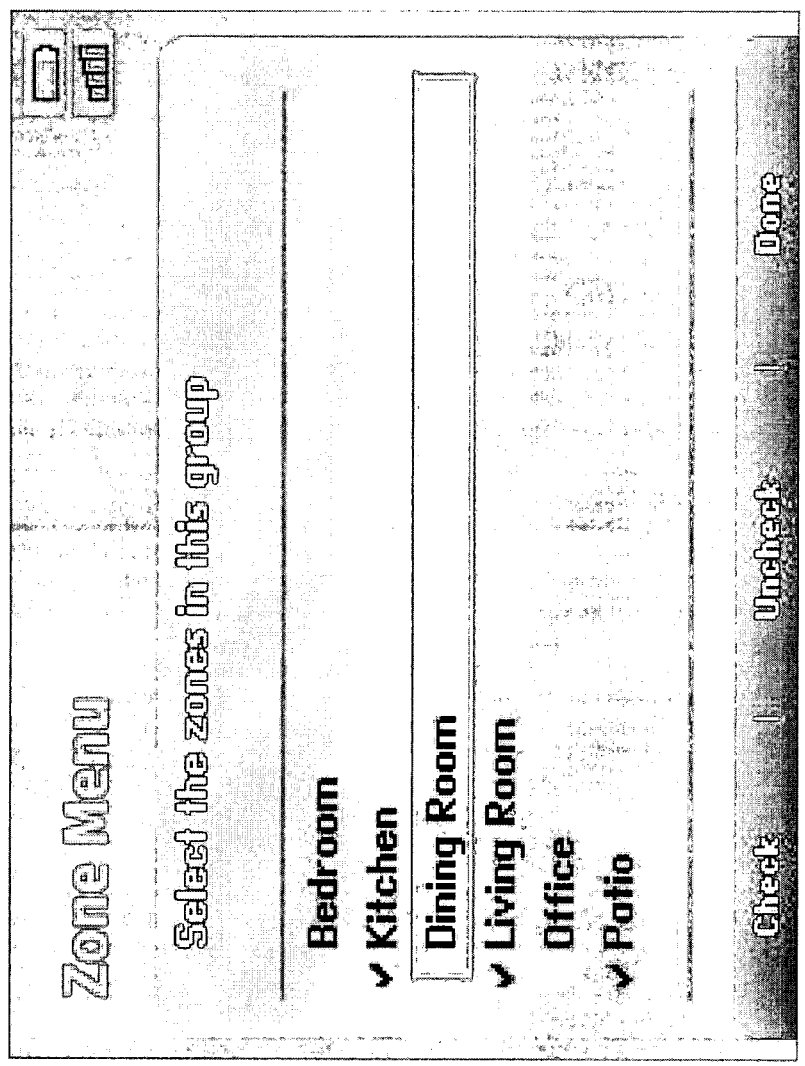
FIG. 5B shows another user interface 520 to allow a user to form a scene.

FIG. 5B shows another user interface 520 to allow a user to form a scene. The user interface 520 that may be displayed on a controller or a computing device, lists available zones in a system. A checkbox is provide next to each of the zones so that a user may check in the zones to be associated with the scene.

FIG. 5C shows a user interface 510 to allow a user to adjust a volume level of the zone players in a zone scene individually or collectively. As shown in the user interface 510, the 'Volumes . . .' button (shown as sliders, other forms are possible) allows the user to affect the volumes of the associated zone players when a zone scene is invoked. In one embodiment, the zone players can be set to retain whatever volume that they currently have when the scene is invoked. Additionally the user can decide if the volumes should be unmuted or muted when the scene is invoked.

Figure 6:
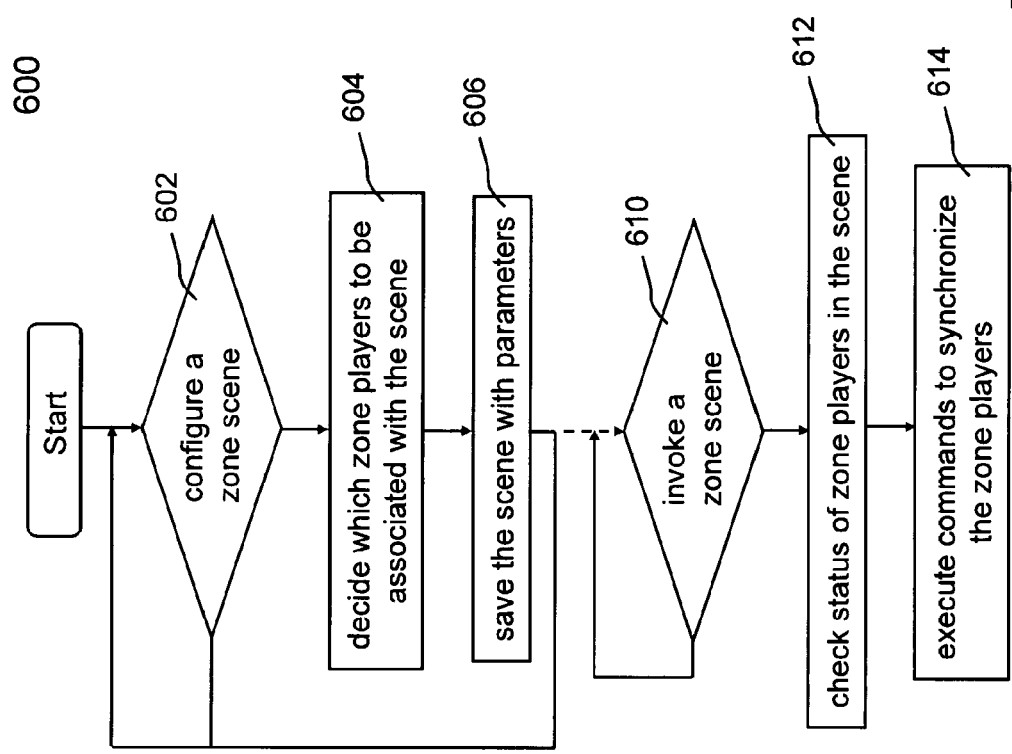
FIG. 6 shows a flowchart or process of providing a player theme or a zone scene for a plurality of players, where one or more of the players are placed in a zone.

FIG. 6 shows a flowchart or process 600 of providing a player theme or a zone scene for a plurality of players, where one or more of the players are placed in a zone. The process 600 is presented in accordance with one embodiment of the present invention and may be implemented in a module to be located in the memory 282 of FIG. 2C.

The process 600 is initiated only when a user decides to proceed with a zone scene at 602. The process 600 then moves to 604 where it allows a user to decide which zone players to be associated with the scene. For example, there are ten players in a household, and the scene is named after "Morning". The user may be given an interface to select four of the ten players to be associated with the scene. At 606, the scene is saved. The scene may be saved in any one of the members in the scene. In the example of FIG. 1, the scene is saved in one of the zone players and displayed on the controller 142. In operation, a set of data pertaining to the scene includes a plurality of parameters. In one embodiment, the parameters include, but may not be limited to, identifiers (e.g., IP address) of the associated players and a playlist. The parameters may also include volume/tone settings for the associated players in the scene. The user may go back to 602 to configure another scene if desired.

Given a saved scene, a user may activate the scene at any time or set up a timer to activate the scene at 610. The process 600 can continue when a saved scene is activated at 610. At 612, upon the activation of a saved scene, the process 600 checks the status of the players associated with the scene. The status of the players means that each of the players shall be in condition to react in a synchronized manner. In one embodiment, the interconnections of the players are checked to make sure that the players communicate among themselves and/or with a controller if there is such a controller in the scene.

It is assumed that all players associated with the scene are in good condition. At 614, commands are executed with the parameters (e.g., pertaining to a playlist and volumes). In one embodiment, data including the parameters is transported from a member (e.g., a controller) to other members in the scene so that the players are caused to synchronize an operation configured in the scene. The operation may cause all players to play back a song in identical or different volumes or to play back a pre-stored file.

One of the features, benefits and advantages in the present invention is to allow sets of related devices (controllers and operating components) to exist as a group without interfering with other components that are potentially visible on the same wired or wireless network. Each of the sets is configured to a theme or a scene.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the invention has applicability well beyond such embodiment, which can be appreciated by those skilled in the art. Accordingly, the scope of the present invention is defined by the appended claims rather than the forgoing description of embodiments.

The invention claimed is:

1. In a network comprising a plurality of independent playback devices, a method comprising:
receiving via the network by a controller device, a zone configuration from one of the plurality of independent playback devices, wherein the zone configuration is maintained at one or more of the plurality of independent playback devices, and wherein the zone configuration characterizes one or more zone scenes, each zone scene identifying a group configuration associated with two or more of the plurality of independent playback devices;

receiving, by the controller device, an input to invoke a zone scene of the one or more zone scenes; and based on the input, instructing, by the controller device, two or more of the plurality of independent playback devices to be grouped in accordance with the invoked zone scene.

2. The method of claim 1, wherein the one or more zone scenes further identify one or more attributes associated with the independent playback devices.

3. The method of claim 2, wherein the one or more attributes comprises one or more of (i) a volume level for audio playback for each independent playback device in the one or more zone scenes, (ii) a mute or unmute setting for audio playback, (iii) a selection and play of specific music, (iv) a play mode setting, (v) an equalization setting for audio playback, and (vi) an audio alarm.

4. The method of claim 1, wherein each of the one or more zone scenes is associated with a name.

5. The method of claim 1, wherein the input comprises an input selecting a specified zone scene from a list of one or more zone scenes.

6. A multimedia controller including a processor, the controller configured to:

receive, via a network interface, a zone configuration from one of a plurality of independent playback devices, wherein the zone configuration is maintained at one or more of the plurality of independent playback devices, and wherein the zone configuration characterizes one or more zone scenes, each zone scene identifying a group configuration associated with two or more of the plurality of independent playback devices;

receive an input to invoke a zone scene of the one or more zone scenes; and based on the input, instruct two or more of the plurality of independent playback devices to be grouped in accordance with the invoked zone scene.

7. The multimedia controller of claim 6, wherein the one or more zone scenes further identify one or more attributes associated with the independent playback devices.

8. The multimedia controller of claim 7, wherein the one or more attributes comprises one or more of (i) a volume level for audio playback for each independent playback device in the one or more zone scenes, (ii) a mute or unmute setting for audio playback, (iii) a selection and play of specific music, (iv) a play mode setting, (v) an equalization setting for audio playback, and (vi) an audio alarm.

9. The multimedia controller of claim 6, wherein each of the one or more zone scenes is associated with a name.

10. The multimedia controller of claim 6, wherein the input to comprises an input selecting a specified zone scene from a list of zone scenes.

11. A non-transitory computer-readable storage medium including a set of instructions for execution by a processor, the set of instructions, when executed, implement a controller configured to:

receive, via a network interface, a zone configuration from one of a plurality of independent playback devices, wherein the zone configuration is maintained at one or more of the plurality of independent playback devices, and wherein the zone configuration characterizes one or more zone scenes, each zone scene identifying a group configuration associated with two or more of the plurality of independent playback devices;

receive an input to invoke a zone scene of the one or more zone scenes; and based on the input, instruct two or more of the plurality of independent playback devices to be grouped in accordance with the invoked zone scene.

12. The computer-readable medium of claim 11, wherein the one or more zone scenes further identify one or more attributes associated with the independent playback devices.

13. The computer-readable medium of claim 12, wherein the one or more attributes comprises one or more of (i) a volume level for audio playback for each independent playback device in the one or more zone scenes, (ii) a mute or unmute setting for audio playback, (iii) a selection and play of specific music, (iv) a play mode setting, (v) an equalization setting for audio playback, and (vi) an audio alarm.

14. The computer-readable medium of claim 11, wherein the set of instructions, when executed, further cause the controller to:

instruct the two or more of the plurality of independent playback devices that were grouped in accordance with the invoked zone scene to synchronously playback first audio content; and instruct a third independent playback device in the network to playback second audio content.

15. The method of claim 1, further comprising:

instructing, by the controller device, the two or more of the plurality of independent playback devices that were grouped in accordance with the invoked zone scene to synchronously playback first audio content; and instructing, by the controller device, a third independent playback device in the network to playback second audio content.

16. The multimedia controller of claim 6, wherein the controller is further configured to instruct the two or more of the plurality of independent playback devices that were grouped in accordance with the invoked zone scene to synchronously playback first audio content; and instruct a third independent playback device in the network to playback second audio content.

* * * * *